(12) United States Patent
Rasera et al.

(10) Patent No.: US 12,388,455 B2
(45) Date of Patent: Aug. 12, 2025

(54) PIECEWISE LINEAR DIGITAL-TO-ANALOG CONVERTER CIRCUIT

(71) Applicant: Apple Inc., Cupertino, CA (US)

(72) Inventors: Nicola Rasera, Munich (DE); Cristian Grecu, Munich (DE); Bogdan-Eugen Matei, Munich (DE); Fabio Ongaro, Unterhaching (DE); Ming Sun, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 147 days.

(21) Appl. No.: 18/338,956

(22) Filed: Jun. 21, 2023

(65) Prior Publication Data

US 2024/0429931 A1 Dec. 26, 2024

(51) Int. Cl.
*H03M 1/10* (2006.01)

(52) U.S. Cl.
CPC .............................. *H03M 1/1014* (2013.01)

(58) Field of Classification Search
CPC ....... H03M 1/10; H03M 1/1014; H03M 1/742
See application file for complete search history.

(56) References Cited

U.S. PATENT DOCUMENTS

| | | | | |
|---|---|---|---|---|
| 5,663,728 A * | 9/1997 | Essenwanger | .... | H04L 25/03834 341/145 |
| 5,949,363 A * | 9/1999 | Kosiak | ................ | B60R 21/0132 327/134 |
| 6,154,121 A * | 11/2000 | Cairns | .................... | H03M 1/664 341/150 |
| 6,392,574 B1 * | 5/2002 | Toosky | .................. | H03M 1/664 341/145 |
| 6,392,578 B1 * | 5/2002 | Russell | ................ | H03M 1/1019 341/126 |
| 6,424,282 B1 * | 7/2002 | Maenza | .............. | H03M 1/0836 341/118 |
| 6,445,325 B1 * | 9/2002 | Burns | .................... | H03M 1/664 341/154 |
| 6,462,688 B1 * | 10/2002 | Sutardja | .............. | H03M 1/0881 341/143 |
| 6,844,837 B1 * | 1/2005 | Sutardja | .................... | H04B 3/32 375/296 |
| 6,850,181 B1 * | 2/2005 | Tsinker | ............... | H03M 1/0845 341/163 |
| 7,145,493 B2 * | 12/2006 | Kwon | .................. | H03M 1/1061 341/135 |
| 7,280,060 B1 * | 10/2007 | Sutardja | ................ | H03M 1/661 375/259 |
| 7,336,212 B2 * | 2/2008 | Fung | .................... | H03M 1/1225 714/740 |

(Continued)

*Primary Examiner* — Lam T Mai
(74) *Attorney, Agent, or Firm* — Kowert, Hood, Munyon, Rankin & Goetzel, P.C.; Dean M. Munyon

(57) ABSTRACT

A piecewise linear current-mode digital-to-analog converter circuit approximates an exponential output current over a range of input codes by generating linearly varying currents with different slopes of different ranges of the input codes. The piecewise linear current-mode digital-to-analog converter circuit includes a current generator circuit that generates the output current based on a reference voltage and a feedback signal. A variable resistance circuit is used to generate the feedback signal using the output current. Respective values of the reference voltage and the variable resistance circuit vary as a function of the input code.

20 Claims, 9 Drawing Sheets

(56) References Cited

U.S. PATENT DOCUMENTS

| | | | |
|---|---|---|---|
| 7,459,959 B2 | 12/2008 | Rader et al. | |
| 7,551,153 B2 | 6/2009 | Adler et al. | |
| RE41,831 E * | 10/2010 | Sutardja | H03K 5/01 375/296 |
| 7,936,292 B2 | 5/2011 | Marraccini et al. | |
| 8,212,703 B2 | 7/2012 | Katsis et al. | |
| 8,223,056 B2 * | 7/2012 | Dura | H03M 1/667 341/172 |
| 9,130,582 B2 * | 9/2015 | Cyrusian | H03M 1/0845 |
| 9,532,427 B2 | 12/2016 | Schiappelli et al. | |
| 9,806,728 B1 * | 10/2017 | Sugimoto | H03M 1/0602 |
| 10,587,280 B2 * | 3/2020 | Chen | H03M 1/1014 |
| 10,630,303 B1 * | 4/2020 | Wang | H03M 1/66 |
| 2003/0160713 A1 * | 8/2003 | Kuyel | H03M 1/1047 341/120 |
| 2005/0001747 A1 * | 1/2005 | Kuyel | H03M 1/1038 341/118 |
| 2005/0046604 A1 * | 3/2005 | Pentakota | H03M 1/0607 341/172 |
| 2005/0146452 A1 * | 7/2005 | Kuyel | H03M 1/1042 341/120 |
| 2005/0270208 A1 * | 12/2005 | Kwon | H03M 1/1061 341/144 |
| 2006/0066463 A1 * | 3/2006 | Confalonieri | H03M 1/687 341/144 |
| 2011/0025540 A1 * | 2/2011 | Katsis | H03M 1/002 341/144 |
| 2011/0037630 A1 * | 2/2011 | McLachlan | H03M 1/1019 341/120 |
| 2011/0227769 A1 * | 9/2011 | Lin | H03M 1/109 341/120 |
| 2013/0016285 A1 * | 1/2013 | Combes | H04N 9/3155 348/E9.054 |
| 2015/0333764 A1 * | 11/2015 | Pastore | H03M 1/68 341/145 |
| 2016/0065234 A1 * | 3/2016 | Lakshmikumar | H03M 1/002 341/145 |
| 2020/0274544 A1 * | 8/2020 | Zhou | H03M 1/1023 |
| 2021/0036711 A1 * | 2/2021 | Yang | H03M 1/687 |
| 2021/0351780 A1 * | 11/2021 | Bal | H03M 1/1014 |
| 2022/0130327 A1 | 4/2022 | Navabi-Shirazi et al. | |
| 2022/0247420 A1 * | 8/2022 | Rajagopal | H03M 1/0836 |
| 2023/0099514 A1 * | 3/2023 | Bal | H03M 1/0626 341/143 |
| 2023/0116785 A1 * | 4/2023 | Yang | H03M 1/468 341/143 |
| 2023/0238972 A1 * | 7/2023 | Neema | H03M 1/687 341/118 |
| 2024/0013848 A1 * | 1/2024 | Abhishek | G11C 29/46 |
| 2024/0187013 A1 * | 6/2024 | Varshney | H03M 1/50 |
| 2024/0187018 A1 * | 6/2024 | Chiang | H03M 1/808 |

* cited by examiner

PIECEWISE LINEAR DIGITAL-TO-ANALOG CONVERTER CIRCUIT

BACKGROUND

Technical Field

This disclosure relates to analog circuits in computer systems and, more particularly, to digital-to-analog converter circuits.

Description of the Related Art

Modern computer systems may include multiple circuits blocks designed to perform various functions. Such circuit blocks can include both analog and digital circuits. Digital circuits typically perform logical or arithmetic operations using bits of information represented by discrete voltage levels. Analog circuits perform a variety of operations, e.g., amplification, using a continuous range of voltage levels.

Digital circuit blocks may include processor circuits, processor core circuits, microcontroller circuits, and the like. Some processor circuits and processor core circuits may include arithmetic logic units (ALUs) that are used to execute software or program instructions.

Analog circuit blocks may include amplifier circuits, voltage reference circuits, current reference circuits, and the like. In various computer systems, analog circuits may be employed as front-end circuits to amplify and equalize signals received via antennas or wired communication channels. Analog circuits may also be employed to amplify signals for transmission via antennas or wired communication channels.

In some cases, digital information needs to be converted into the analog domain. For example, digital audio information needs to be converted to an analog signal in order to drive a speaker. Another case where digital information needs to be converted is in driving displays. Image processing is commonly performed in the digital domain, but digital luminance and chroma information for a given pixel often must be converted into analog voltages and currents in order to drive a display connected to a computer system.

DETAILED DESCRIPTION OF EMBODIMENTS

Figure 1:
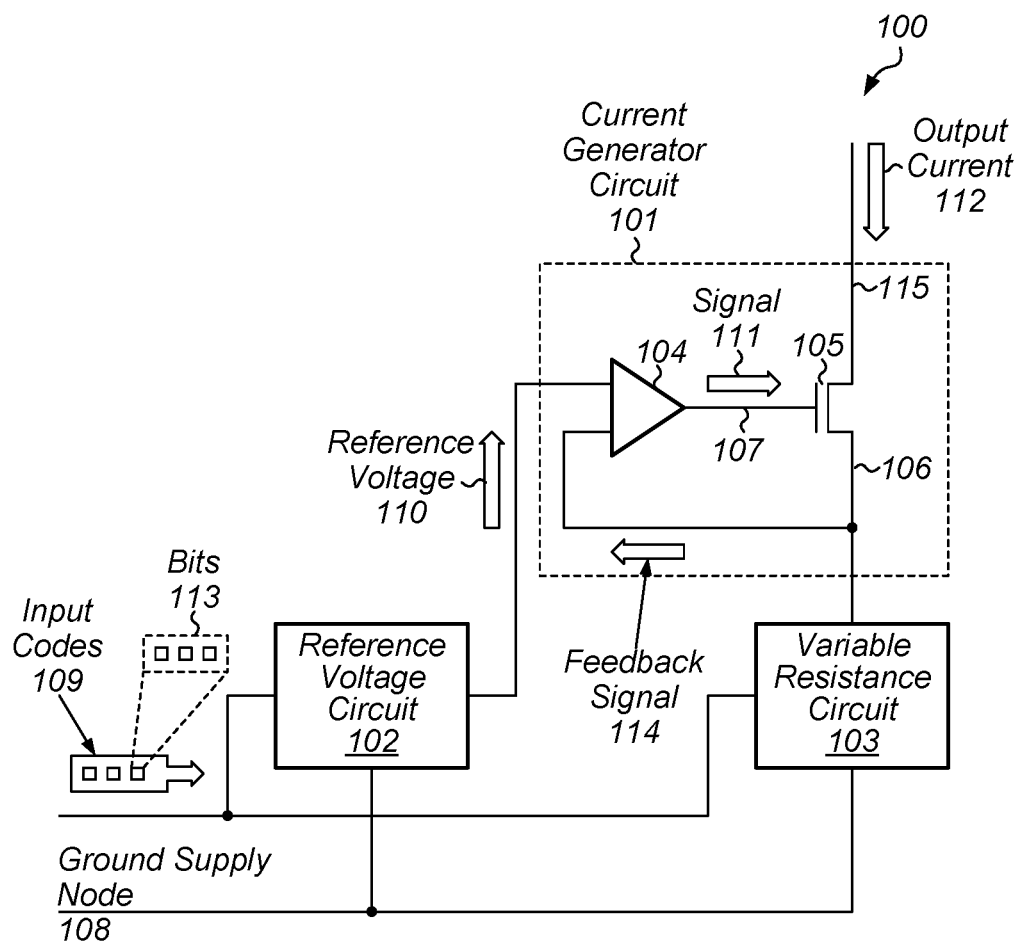
FIG. 1 is a block diagram of an embodiment of a piecewise linear digital-to-analog converter circuit.

Computer systems often need to convert digital information into an analog signal. To accomplish this, computer systems can include one or more digital-to-analog converter (DAC) circuits. In general, a DAC circuit generates an output voltage that corresponds to a value of one or more bits in the digital domain. In some cases, rather than generating an output voltage, a DAC circuit can generate an output current that corresponds to the value of one or more bits. Such DAC circuits can referred to as current-mode DAC circuits or IDAC circuits.

IDAC circuits are often employed in display sub-systems as they can provide the current necessary to drive light-emitting diodes ("LEDs). In such systems, LEDs are coupled in series with corresponding IDAC circuits between a power supply node and a ground supply node. The IDAC circuits provide current through corresponding LEDs based on input codes that correspond to various brightness levels. In some cases, the voltage levels of circuit nodes between the LEDs and their corresponding IDAC circuits are monitored to ensure a minimum functional voltage across all of the IDAC circuits in a display sub-system.

Like other types of diodes, LEDs have an exponential current-voltage (I-V) curve. As such, a small change in voltage across an LED can result in a large change in the current flowing through the LED. Moreover, LEDs have a negative coefficient of voltage with respect to temperature, so an LED will allow more current to pass as the temperature of the LED increases. A circuit driving an LED needs to comprehend both the large range of current that can flow through an LED, and the current variation due to temperature changes in order to provide a desired level of illumination for a given input code while preventing an over-current situation due to temperature variation. In some cases, currents larger than 500 mA may be needed, which can result in impractical sizes of some of the circuit elements in an IDAC circuit. Additionally, an IDAC circuit used in a display sub-system must comprehend a desired range of light intensity by providing the necessary current range to an LED.

Moreover, the human eye can accommodate a high range of light intensity, with the ratio between the highest brightness level and lowest brightness level (referred to as the "dimming ratio"). A high dimming ratio necessitates a large range on the value of the output current that an IDAC circuit needs to be able to provide when driving an LED in a display sub-system.

The design of an IDAC circuit that provides an exponential current is impractical in currently available CMOS technologies. Instead, some computer systems employ an interpolation IDAC circuit that includes a linear IDAC circuit along with a lookup table which is used to determine the output current of the IDAC circuit for a given input code in order to provide the desired exponential response. Such a design requires additional bits in the input code words and has the added complexity of the lookup table.

The embodiments described herein employ a current-mode digital-to-analog converter circuit that generates linearly varying currents with different slopes of corresponding ranges of input codes to approximate an output current that varies exponentially with the input codes. By employing a voltage reference and variable resistance that vary as a function of input codes, an approximate exponential response can be generated without the added complexity of lookup tables and additional bits in the code words.

A block diagram of an embodiment of a piecewise linear digital-to-analog converter circuit is depicted. As illustrated, piecewise linear digital-to-analog converter circuit 100 includes current generator circuit 101, reference voltage circuit 102, and variable resistance circuit 103.

Current generator circuit 101 is configured to generate output current 112 that approximates an exponential variation with respect to input codes 109 using reference voltage 110 and feedback signal 114. In various embodiments, current generator circuit 101 includes comparator circuit 104 and transistor 105, which are employed to generate output current 112. As described below, current generator circuit 101 may be configured to operate in a manner similar to a voltage-to-current converter circuit such that a magnitude of output current 112 is based on a difference between reference voltage 110 and feedback signal 114.

Reference voltage circuit 102 is configured to determine corresponding values for reference voltage 110 for input codes 109. In various embodiments, a given one of input codes 109 includes bits 113. A number of bits included in bits 113 may be based on the differential nonlinearity of piecewise linear digital-to-analog converter circuit 100.

Variable resistance circuit 103 is coupled to current generator circuit 101 via node 106 and is configured to adjust a resistance between node 106 and ground supply node 108 based on input codes 109. Additionally, variable resistance circuit 103 is configured to generate feedback signal 114 using output current 112. Variable resistance circuit 103 may be implemented using multiple resistors and switches, or transistors, or any other suitable circuits configured to change the resistance between node 106 and ground supply node 108 as a function of input codes 109.

For a given input code of input codes 109, different ones of bits 113 may be used to determine a value for reference voltage 110 and the resistance between current generator circuit 101 and ground supply node 108. In some embodiments, a first subset of bits 113 may be used to determine the value for reference voltage 110, while a second subset of bits 113 may be used to adjust the resistance between node 106 and ground supply node 108. In various embodiments, the second subset of bits 113 may be less significant than the first subset of bits 113.

As noted above, current generator circuit 101 may be implemented using comparator circuit 104 and transistor 105. In various embodiments, comparator circuit 104 is configured to generate signal 111 on node 107 using reference voltage 110 and feedback signal 114. In some embodiments, to generate signal 111, comparator circuit 104 may be configured to compare reference voltage 110 to feedback signal 114 and generate signal 111 such that a magnitude of signal 111 may be proportional to a difference between reference voltage 110 and feedback signal 114. In some cases, feedback signal 114 may correspond to a voltage drop across variable resistance circuit 103.

Transistor 105 is coupled between output node 115 and node 106 and is controlled by signal 111. In various embodiments, transistor 105 is configured to adjust a conductance between output node 115 and node 106 based on a value of signal 111. Transistor 105 may be implemented using an n-channel metal-oxide semiconductor field-effect transistor (MOSFET), fin field-effect transistor (FinFET), gate-all-around field-effect transistor (GAAFET), or any other suitable transconductance device.

It is noted that although the embodiment of FIG. 1 depicts an n-channel device in current generator circuit 101, in other embodiments, a p-channel dual of current generator circuit 101 may be employed.

Figure 2:
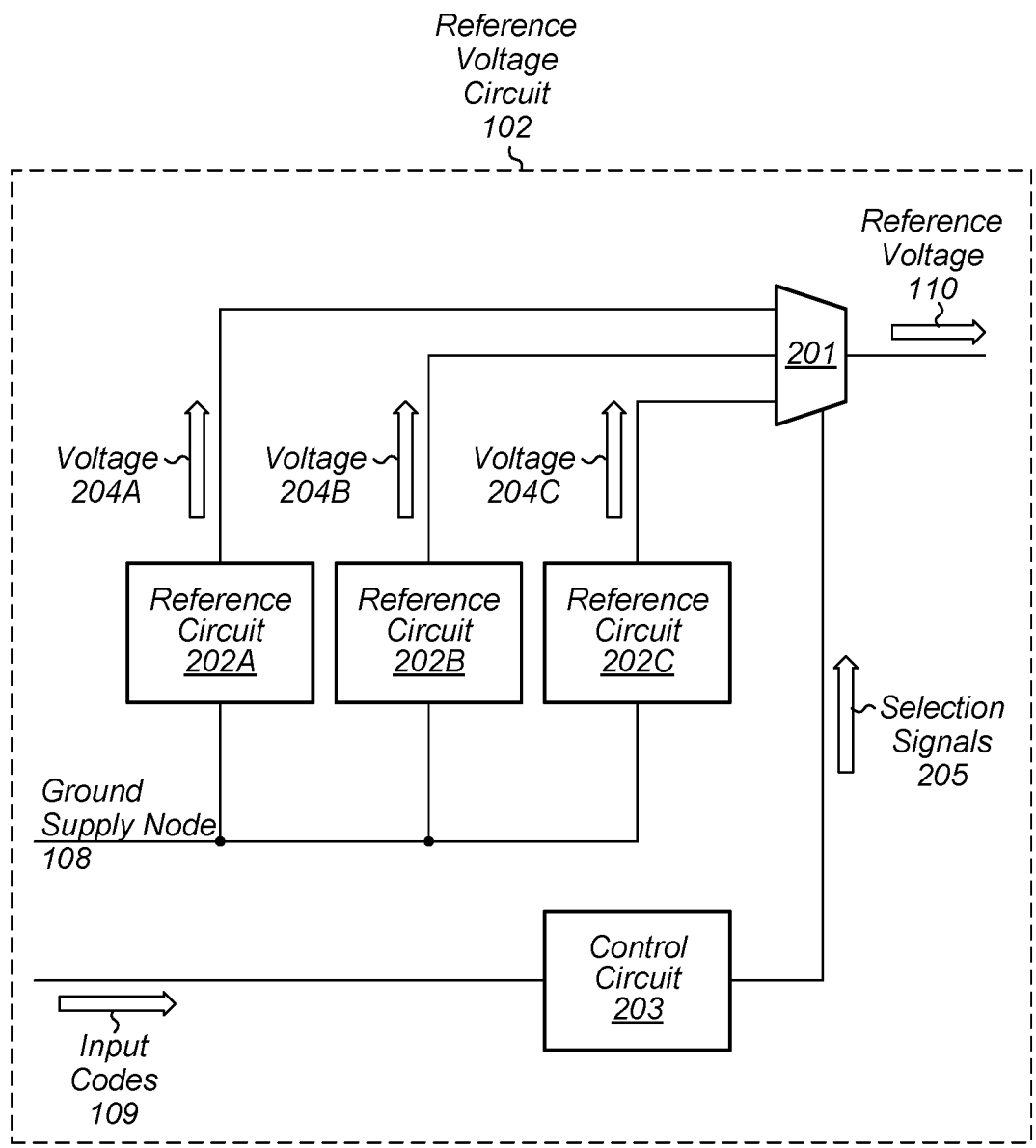
FIG. 2 is a block diagram of an embodiment of a voltage reference circuit for use with a piecewise linear digital-to-analog converter circuit.

Turning to FIG. 2, a block diagram of reference voltage circuit 102 is depicted. As illustrated, reference voltage circuit 102 includes multiplex circuit 201, reference circuits 202A-202C, and control circuit 203.

Multiplex circuit 201 is configured to select, based on selection signals 205, one of voltages 204A-204C to generate reference voltage 110. For example, in response to the activation of a particular one of selection signals 205, multiplex circuit 201 may be configured to select voltage 204A, while, in response to the activation of a different one of selection signals 205, multiplex circuit 201 may be configured to select voltage 204B. Multiplex circuit 201 may be implemented using multiple complementary metal-oxide semiconductor (CMOS) pass-gate circuits coupled together in a wired-OR fashion, or any other suitable type of analog multiplex circuit.

Reference circuits 202A-202C are coupled to ground supply node 108 and are configured to generate voltages 204A-204C, respectively. In various embodiments, reference circuits 202A-202C may be implemented using any suitable voltage reference circuits, e.g., bandgap reference circuits, configured to generate temperature and/or supply independent reference voltages.

Although only three reference circuits are depicted in the embodiment of FIG. 2, in other embodiments, any suitable number of reference circuits may be employed. In some embodiments, a number of reference circuits may be based on a desired level of linearity over a particular voltage range for the digital-to-analog conversion performed by piecewise linear digital-to-analog converter circuit 100. In some embodiments, voltages 204B and 204C may be multiples of two of voltage 204A. For example, voltage 204B may be twice voltage 204A, and voltage 204C may be four times voltage 204A.

Control circuit 203 is configured to generate selection signals 205 using input codes 109. In various embodiments, control circuit 203 may compare one or more bits included in input codes 109 to various threshold values. In response to the one or more bits exceeding a particular threshold value, control circuit 203 may be configured to activate a particular one of selection signals 203 in order to select a particular voltage of voltages 204A-204C.

In various embodiments, control circuit 203 may be configured to generate selection signals 205 such that a number of signals included in selection signals 205 corresponds to a number of reference circuits. Control circuit 203 may be implemented using any suitable combination of combinatorial and sequential logic circuits.

Figure 3:
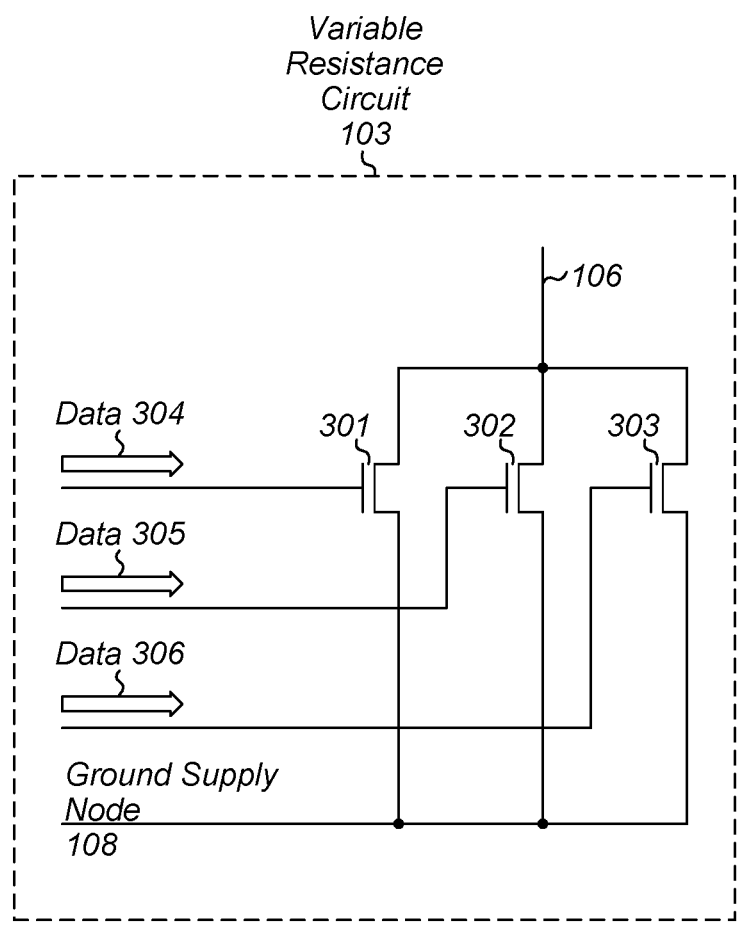
FIG. 3 is a block diagram of an embodiment of a variable resistance circuit.

Turning to FIG. 3, a block diagram of an embodiment of variable resistance circuit 103 is depicted. As illustrated, variable resistance circuit 103 includes transistors 301-303. It is noted that although three transistors are depicted in the embodiment of FIG. 3, in other embodiments, different numbers of transistors may be employed.

Transistor 301 is coupled between node 106 and ground supply node 108 and is controlled by data 304. In a similar fashion, transistors 302 and 303 are coupled between node 106 and ground supply node 108, and are controlled by data 305 and data 306, respectively. In various embodiments, data 304-306 may be a subset of bits included in input codes 109. Alternatively, data 304-306 may be based on corresponding combinations of a subset of bits included in input codes 109.

Transistor 301 is configured to couple node 106 to ground supply node 108 in response to an activation of data 304. In a similar fashion, transistors 302 and 303 are also configured to couple node 106 to ground supply node 108 in response to activations of data 305 and 306, respectively. A resistance between node 106 and ground supply node 108 is based on a number of transistors 301-303 that are active at the same time and the on-resistances of the active ones of transistors 301-303. In various embodiments, physical characteristics, e.g., transistor width, may be different for transistors 301-303.

In various embodiments, transistors 301-303 may be implemented as n-channel MOSFETs, FinFETs, GAAFETs, or any other suitable transconductance devices. Although transistors 301-303 are depicted as individual transistors, in other embodiments, any of transistors 301-303 may be implemented using multiple transistors in parallel.

Figure 4:
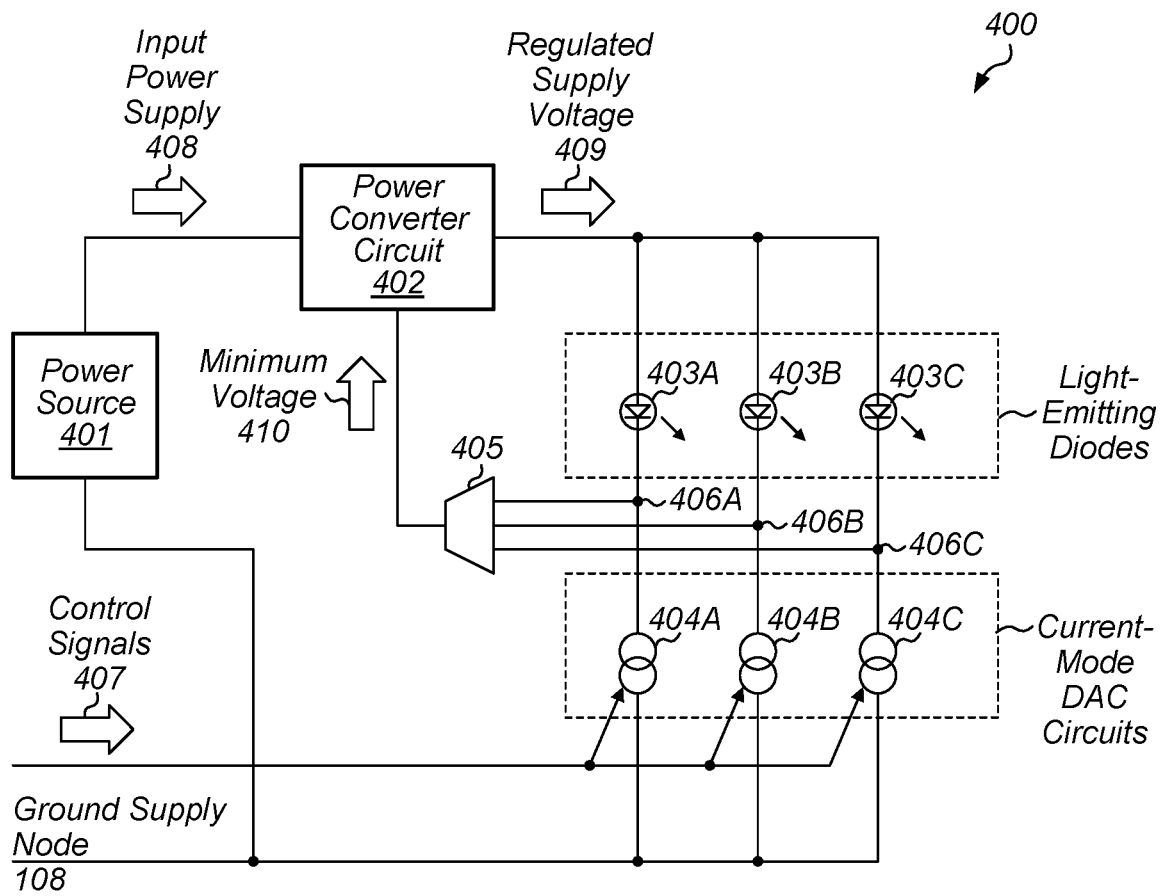
FIG. 4 is a block diagram of an embodiment of a light-emitting diode (LED) driver circuit that employs a piecewise linear digital-to-analog converter circuit.

Turning to FIG. 4, a block diagram of a LED driver circuit that may be included in a display sub-system of a computer system is depicted. As illustrated, LED driver circuit 400 includes power source 401, power converter circuit 402, light-emitting diodes 403A-403C, current-mode DAC circuits 404A-404C, and multiplex circuit 405.

Power source 401 is coupled to ground supply node 108 and is configured to generate input power supply 408. In various embodiments, power source 401 may be implemented using a battery or a power supply circuit that can include one or more power converter circuits or voltage regulator circuits.

Power converter circuit 402 is configured to generate regulated supply voltage 409 using input power supply 408 and minimum voltage 410. As described below, minimum voltage 410 is a minimum of the respective voltages of nodes 406A-406C. By employing the minimum of the respective voltages of nodes 406A-406C, power converter circuit 402 can maintain the voltage level of regulated supply voltage 409 to ensure a full-range of brightness on light-emitting diodes 403A-403C. In various embodiments, power converter circuit 402 may be implemented using a buck converter circuit or any other suitable power converter or voltage regulator circuit.

Multiplex circuit 405 is configured to select a minimum of the respective voltage levels of nodes 406A-406C to generate minimum voltage 410. In various embodiments, multiplex circuit 405 may be implemented using multiple pass-gate circuits coupled together in a wired-OR fashion along with a comparator circuit configured to compare the respective voltages of nodes 406A-406C to each other.

Light-emitting diodes 403A-403C are configured to generate light using regulated supply voltage 409 and current sunk from nodes 406A-406C, respectively, by corresponding ones of current-mode DAC circuits 404A-404C. In various embodiments, different ones of light-emitting diodes 403A-403C may be configured to generate different wavelengths and, therefore, colors of light. Although only three light-emitting diodes are depicted in the embodiment of FIG. 4, in other embodiments, any suitable number of light-emitting diodes may be employed.

Current-mode DAC circuits 404A-404C are configured to sink, based on control signals 407, corresponding currents from nodes 406A-406C, respectively. In various embodiments, current-mode DAC circuits 404A-404C may correspond to piecewise linear digital-to-analog converter circuit 100 as depicted in FIG. 1. Different ones of control signals 407 may correspond to input codes 109. Although only three current-mode DAC circuits are depicted in the embodiment of FIG. 4, in various embodiments, the number of current-mode DAC circuits may correspond to a number of light-emitting diodes that are employed.

Figure 5:
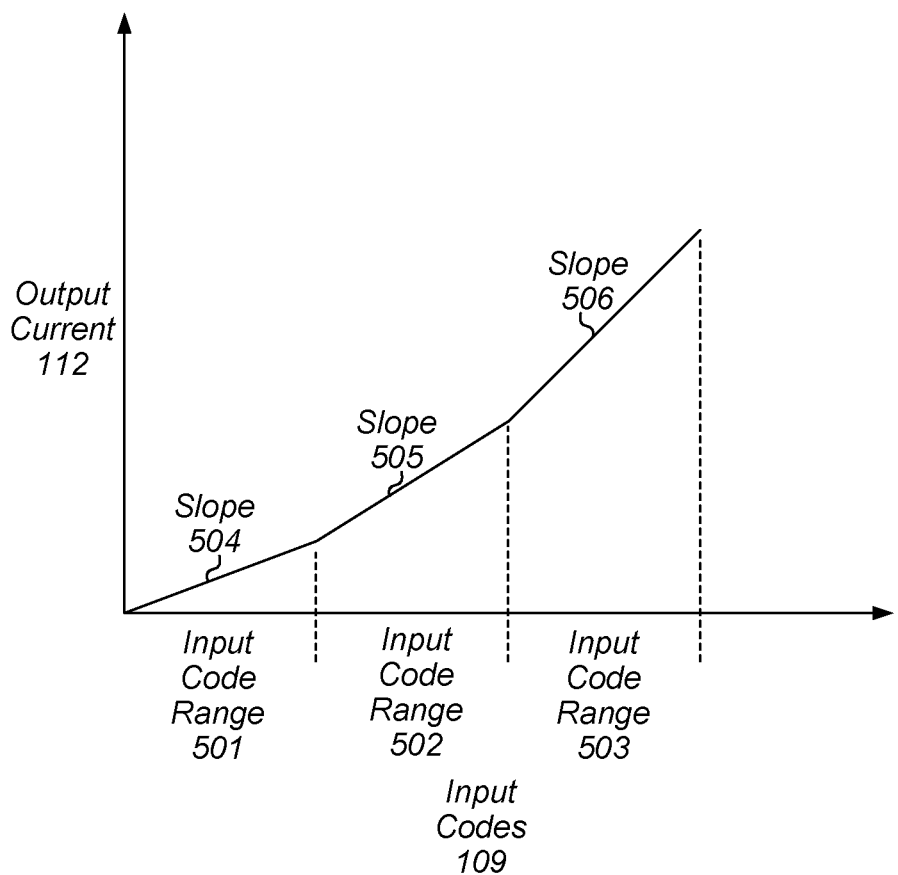
FIG. 5 illustrates example waveforms depicting output current as a function of input code for a piecewise linear digital-to-analog converter circuit.

Turning to FIG. 5, example waveforms depicting output current as a function of input code for a piecewise linear digital-to-analog converter circuit are illustrated. It is noted that the illustrated waveforms are merely examples and that, in various embodiments, the waveforms may be different slopes over the different code ranges and different numbers of points where the slope changes.

Over input code range 501, output current 112 varies linearly with slope 504 and the least-significant-bits of input codes 109 increase from a minimum value to a maximum value. Once the least-significant-bits of the input code reach the maximum value, input code range 501 ends and input code range 502 begins.

The difference between input code range 501 and input code range 502 is that one or more bits of the input code that are more significant than the least-significant-bits have increased in value. In response to the different value of the one or more bits, a different value for reference voltage 110 is selected. With the different value for reference voltage 110 as the least-significant-bits increase from the minimum value to the maximum value, and output current 112 increases linearly with slope 505, which is greater than slope 504. Once the least-significant-bits of input codes 109 reach the maximum value, input code range 502 ends and input code range 503 begins.

The difference between input code range 502 and input code range 503 is that one or more bits of input codes 109 that are more significant than the least-significant-bits have further increased in value. In response to the different value of the one or more bits, a new value for reference voltage 110 is selected. With the new value for reference voltage 110, the least-significant-bits increase from the minimum value to the maximum value, and output current 112 increases linearly with slope 506, which is greater than slopes 504 and 505.

Since the slope of output current 112 increases in each of the input code ranges, the overall response of output current 112 with respect to input codes 109 approximates an exponential curve. Although only three input code ranges are depicted in the example waveforms of FIG. 5, in other embodiments, any suitable number of input code ranges may be employed. In cases where a closer approximation of an exponential curve is desired, additional input codes ranges and corresponding reference voltages may be employed.

To summarize, various embodiments of a piecewise linear current-mode digital-to-analog converter circuit are disclosed. Broadly speaking, piecewise linear a current-mode digital-to-analog converter circuit includes a current generator circuit, a reference voltage circuit and a variable resistance circuit. The current generator circuit may be configured to generate an output current that approximates an exponential variation with respect to a plurality of input codes using a reference voltage and a feedback signal. The reference voltage circuit may be configured to determine respective values for a reference voltage for the plurality of input codes. The variable resistance circuit is coupled to the voltage-to-current converter circuit and may be configured to adjust a resistance between the voltage-to-current converter circuit and a ground supply node based on the plurality of input codes, and to generate the feedback signal using the output current.

Figure 6:
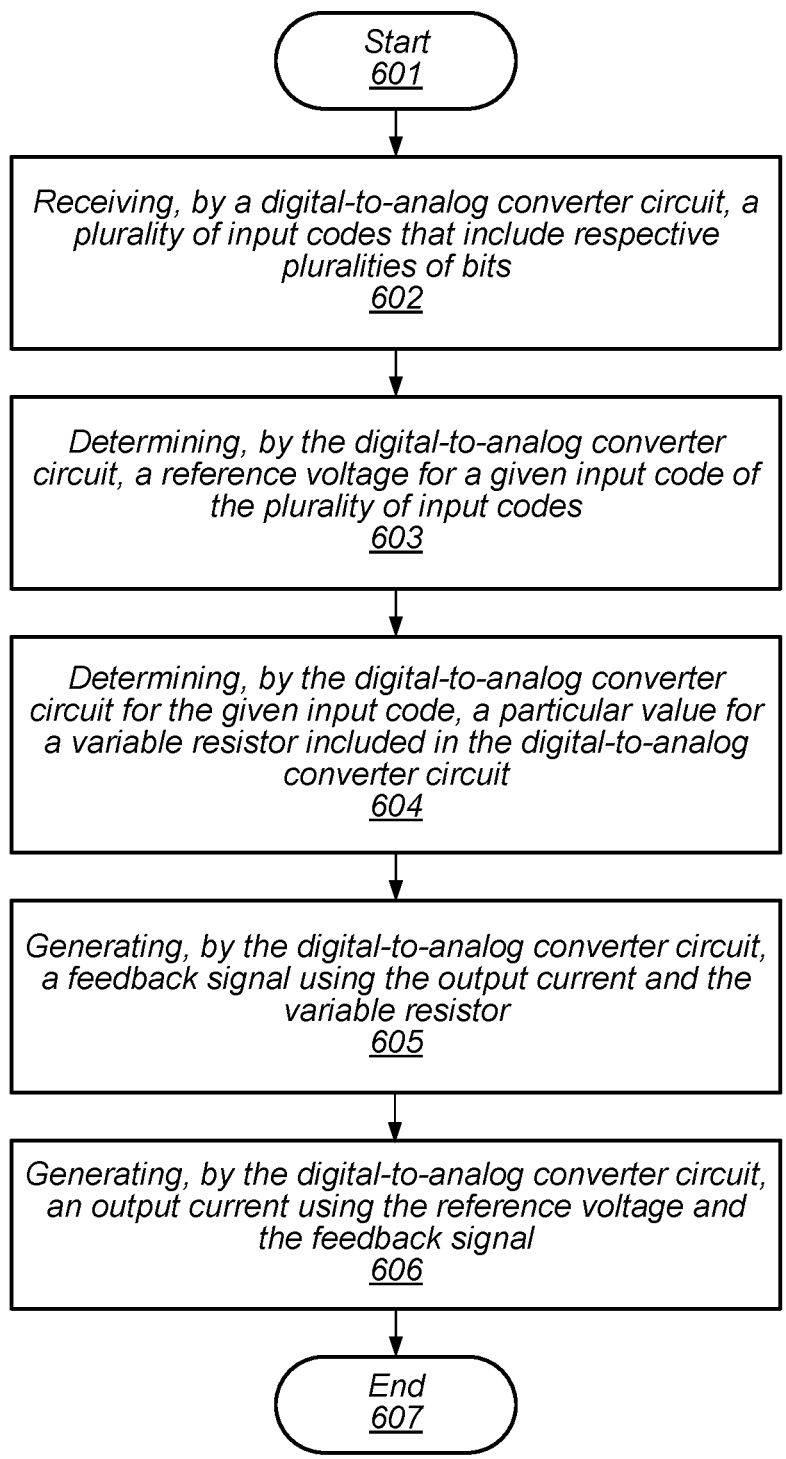
FIG. 6 is a flow diagram depicting an embodiment of a method for operating a piecewise linear digital-to-analog converter circuit.

Turning to FIG. 6, a flow diagram depicting an embodiment of a method for operating a piecewise linear digital-to-analog converter circuit is illustrated. The method, which begins at block 601, may be applied to various digital-toanalog converter circuit including piecewise linear digital-to-analog converter circuit 100 as depicted in FIG. 1.

The method includes receiving, by a digital-to-analog converter circuit, a plurality of input codes that include respective pluralities of bits (block 602). It is noted that the number of bits included in a given input code may be based on various factors such as a desired resolution in the brightness of light-emitting diodes used in a display.

The method further includes determining, by the digital-to-analog converter circuit, a reference voltage for a given input code of the plurality of input codes (block 603). In various embodiments, the method may further include determining the reference voltage based on a first subset of a plurality of bits included in the given input code. In other embodiments, the digital-to-analog converter circuit may include multiple voltage reference circuits generating corresponding sets of reference voltages. In such cases, determining the reference voltage may include selecting, using the first subset, a particular one of the set of reference voltages.

The method also includes determining, by the digital-to-analog converter circuit for the given input code, a particular value for a variable resistor included in the digital-to-analog converter circuit (block 604). In some embodiments, determining the particular value of the variable resistor may include determining the particular value based on a second subset of the number of bits included in the given input code, where the second subset is different than the first subset. In some cases, the second subset may include a set of least-significant-bits of the plurality of bits included in the given input code, and the first subset may include a set of bits of more significance than those in the second subset.

The method further includes generating, by the digital-to-analog converter circuit, a feedback signal using the output current and the variable resistor (block 605). In various embodiments, the variable resistor can include multiple resistors and switches that are controlled by the second subset of the bits included in the given input code.

The method also includes generating, by the digital-to-analog converter circuit, an output current using the reference voltage and the feedback signal (block 606). In various embodiments, the output current approximates an exponential variation with respect to the plurality of input codes. In some embodiments, the digital-to-analog converter circuit includes at least one transistor coupled in series with the variable resistor between a power supply node and a ground supply node. In such cases, generating the output current includes adjusting the conductance of the at least one transistor. In some embodiments, the method may also include comparing the reference voltage to the feedback signal to generate a control signal, and adjusting the conductance of the at least one transistor using the control signal.

In some cases, the digital-to-analog converter circuit may be included in a display sub-system of a computer system that includes multiple light-emitting diodes. In such cases, the method may further include activating a light-emitting diode by sinking the output current from a cathode terminal of the light-emitting diode, where the anode of the light-emitting diode is coupled to a power supply node. The method concludes in block 607.

Figure 7:
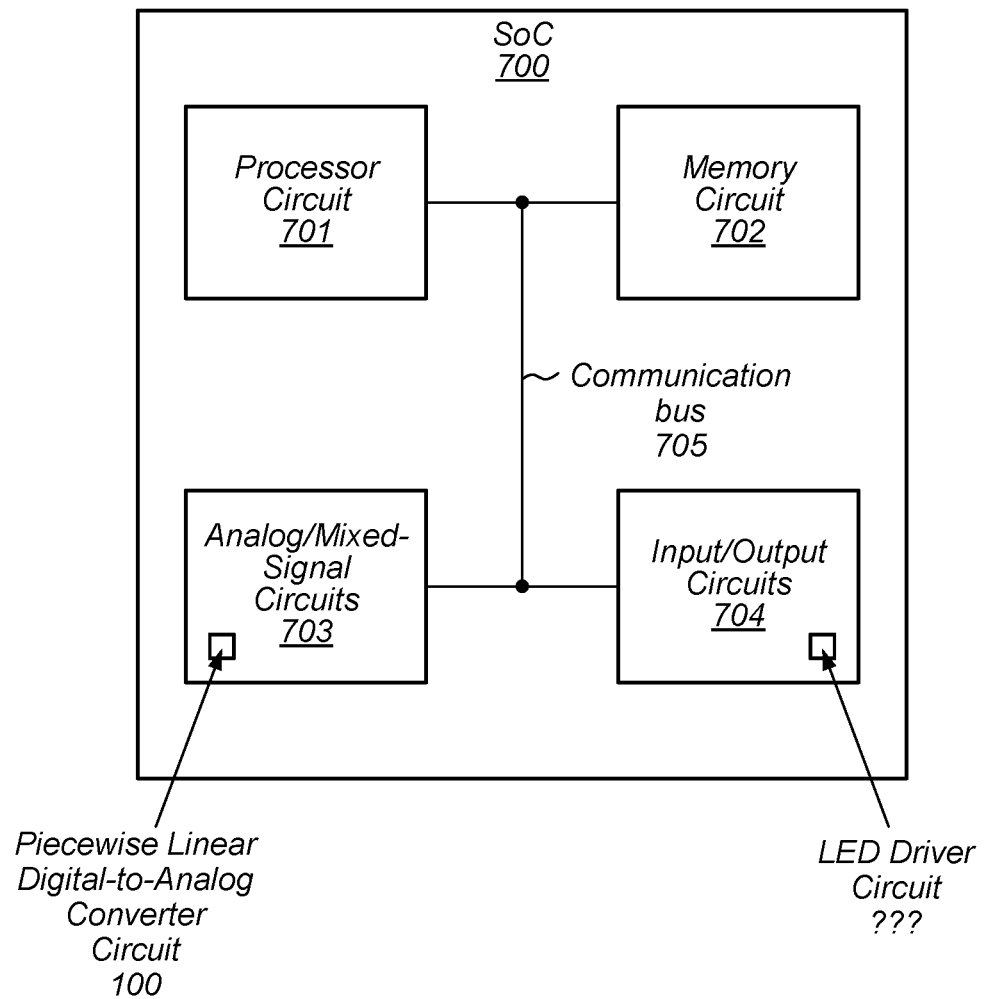
FIG. 7 is a block diagram of one embodiment of a system-on-a-chip that includes a power management circuit.

A block diagram of a system-on-a-chip (SoC) is illustrated in FIG. 7. In the illustrated embodiment, SoC 700 includes processor circuit 701, memory circuit 702, analog/mixed-signal circuits 703, and input/output circuits 704, each of which is coupled to communication bus 705. In various embodiments, SoC 700 may be configured for use in a desktop computer, server, or in a mobile computing application such as, e.g., a tablet, laptop computer, or wearable computing device.

Processor circuit 701 may, in various embodiments, be representative of a general-purpose processor that performs computational operations. For example, processor circuit 701 may be a central processing unit (CPU) such as a microprocessor, a microcontroller, an application-specific integrated circuit (ASIC), or a field-programmable gate array (FPGA).

Memory circuit 702 may, in various embodiments, include any suitable type of memory such as a Dynamic Random-Access Memory (DRAM), a Static Random-Access Memory (SRAM), a Read-Only Memory (ROM), an Electrically Erasable Programmable Read-only Memory (EEPROM), or a non-volatile memory, for example. It is noted that although a single memory circuit is illustrated in FIG. 7, in other embodiments, any suitable number of memory circuits may be employed.

As illustrated, analog/mixed-signal circuits 703 includes piecewise linear digital-to-analog converter circuit 100. In various embodiments, analog/mixed-signal circuits 703 may also include a crystal oscillator circuit, a phase-locked loop (PLL) circuit, an analog-to-digital converter (ADC) circuit, and a digital-to-analog converter (DAC) circuit (all not shown). In other embodiments, analog/mixed-signal circuits 703 may be configured to perform power management tasks with the inclusion of on-chip power supplies and voltage regulator circuits.

Input/output circuits 704 may be configured to coordinate data transfer between SoC 700 and one or more peripheral devices. In various embodiments, input/output circuits 704 can include LED driver circuit 400. Such peripheral devices may include, without limitation, storage devices (e.g., magnetic or optical media-based storage devices including hard drives, tape drives, CD drives, DVD drives, displays, etc.), audio processing subsystems, or any other suitable type of peripheral devices. In some embodiments, input/output circuits 704 may be configured to implement a version of Universal Serial Bus (USB) protocol or IEEE 1394 (Firewire®) protocol.

Input/output circuits 704 may also be configured to coordinate data transfer between SoC 700 and one or more devices (e.g., other computing systems or integrated circuits) coupled to SoC 700 via a network. In one embodiment, input/output circuits 704 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 704 may be configured to implement multiple discrete network interface ports.

Figure 8:
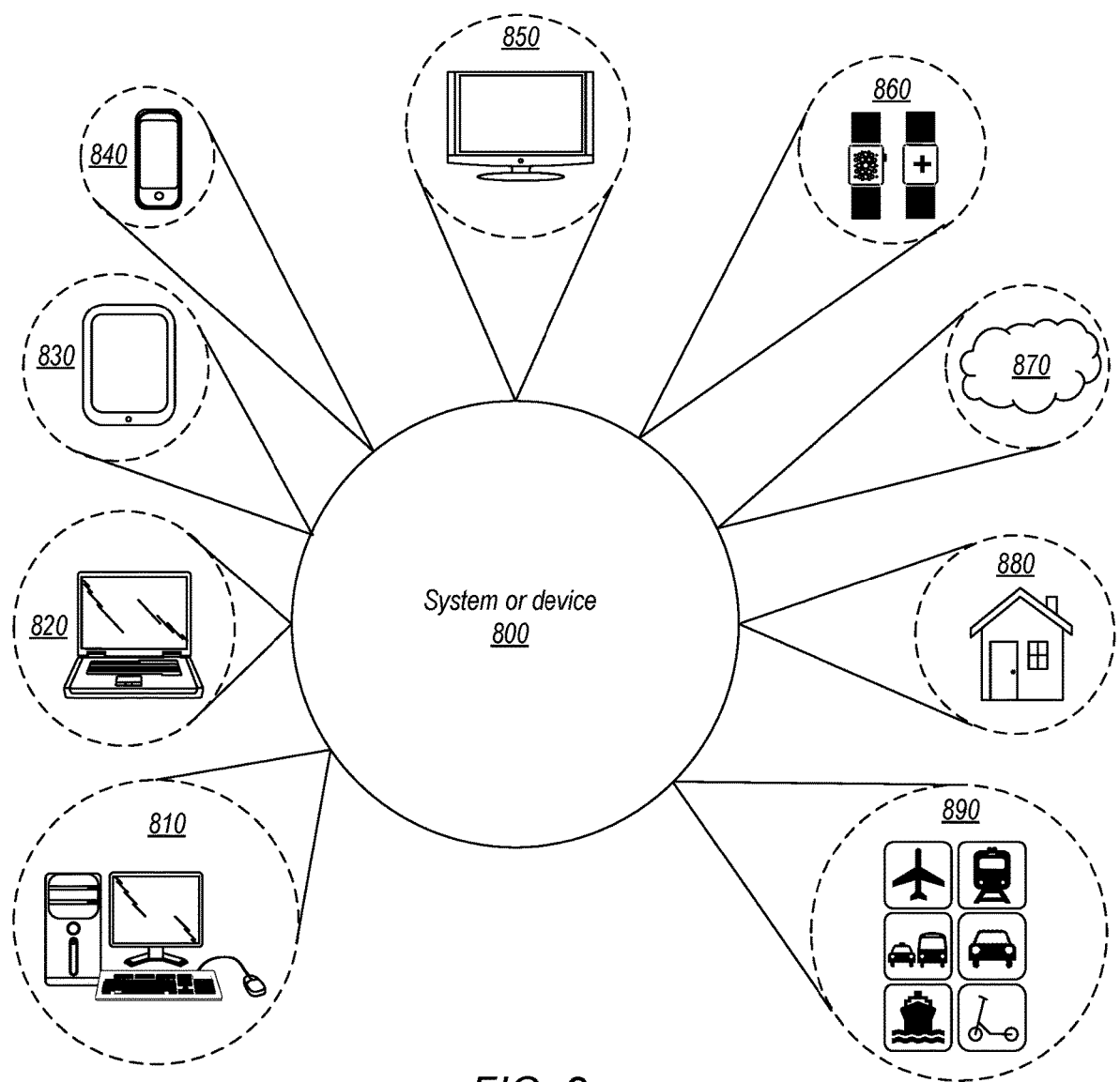
FIG. 8 is a block diagram of various embodiments of computer systems that may include power management circuits.

Turning now to FIG. 8, various types of systems that may include any of the circuits, devices, or systems discussed above are illustrated. System or device 800, which may incorporate or otherwise utilize one or more of the techniques described herein, may be utilized in a wide range of areas. For example, system or device 800 may be utilized as part of the hardware of systems such as a desktop computer 810, laptop computer 820, tablet computer 830, cellular or mobile phone 840, or television 850 (or set-top box coupled to a television).

Similarly, disclosed elements may be utilized in a wearable device 860, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 800 may also be used in various other contexts. For example, system or device 800 may be utilized in the context of a server computer system, such as a dedicated server or on shared hardware that implements a cloud-based service 870. Still further, system or device 800 may be implemented in a wide range of specialized everyday devices, including devices 880 commonly found in the home such as refrigerators, thermostats, security cameras, etc. The interconnection of such devices is often referred to as the "Internet of Things" (IoT). Elements may also be implemented in various modes of transportation. For example, system or device 800 could be employed in the control systems, guidance systems, entertainment systems, etc. of various types of vehicles 890.

The applications illustrated in FIG. 8 are merely exemplary and are not intended to limit the potential future applications of disclosed systems or devices. Other example applications include, without limitation: portable gaming devices, music players, data storage devices, unmanned aerial vehicles, etc.

Figure 9:
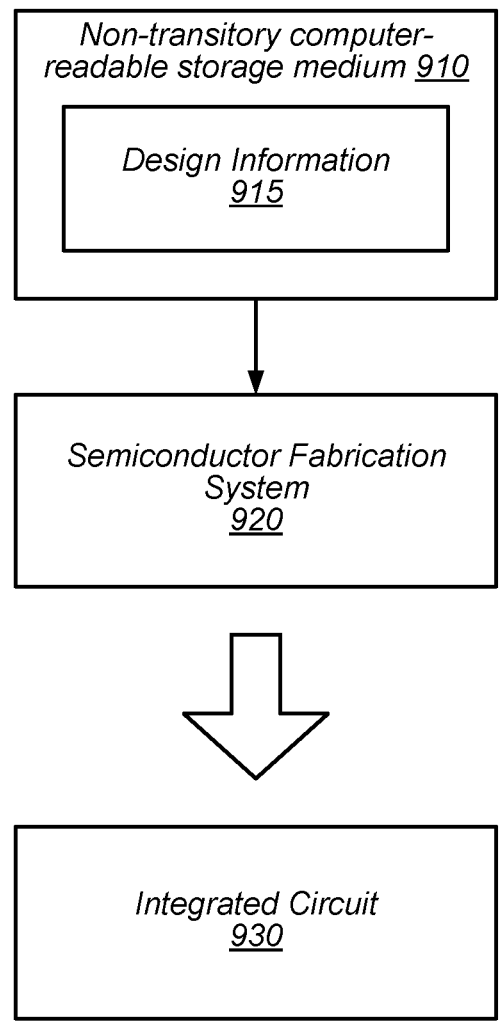
FIG. 9 illustrates an example of a non-transitory computer-readable storage medium that stores circuit design information.

FIG. 9 is a block diagram illustrating an example of a non-transitory computer-readable storage medium that stores circuit design information, according to some embodiments. In the illustrated embodiment, semiconductor fabrication system 920 is configured to process design information 915 stored on non-transitory computer-readable storage medium 910 and fabricate integrated circuit 930 based on design information 915.

Non-transitory computer-readable storage medium 910 may comprise any of various appropriate types of memory devices or storage devices. Non-transitory computer-readable storage medium 910 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as Flash, magnetic media, e.g., a hard drive, or optical storage; registers, or other similar types of memory elements, etc. Non-transitory computer-readable storage medium 910 may include other types of non-transitory memory as well or combinations thereof. Non-transitory computer-readable storage medium 910 may include two or more memory mediums, which may reside in different locations, e.g., in different computer systems that are connected over a network.

Design information 915 may be specified using any of various appropriate computer languages, including hardware description languages such as, without limitation: VHDL, Verilog, SystemC, SystemVerilog, RHDL, M, MyHDL, etc. Design information 915 may be usable by semiconductor fabrication system 920 to fabricate at least a portion of integrated circuit 930. The format of design information 915 may be recognized by at least one semiconductor fabrication system, such as semiconductor fabrication system 920, for example. In some embodiments, design information 915 may include a netlist that specifies elements of a cell library, as well as their connectivity. One or more cell libraries used during logic synthesis of circuits included in integrated circuit 930 may also be included in design information 915. Such cell libraries may include information indicative of device or transistor-level netlists, mask design data, characterization data, and the like, of cells included in the cell library.

Integrated circuit 930 may, in various embodiments, include one or more custom macrocells, such as memories, analog or mixed-signal circuits, and the like. In such cases, design information 915 may include information related to included macrocells. Such information may include, without limitation, schematics capture database, mask design data, behavioral models, and device or transistor-level netlists. As used herein, mask design data may be formatted according to graphic data system (GDSII), or any other suitable format.

Semiconductor fabrication system 920 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 920 may also be configured to perform various testing of fabricated circuits for correct operation.

In various embodiments, integrated circuit 930 is configured to operate according to a circuit design specified by design information 915, which may include performing any of the functionality described herein. For example, integrated circuit 930 may include any of various elements shown or described herein. Further, integrated circuit 930 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent claims that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some tasks even if the structure is not currently being operated. Thus, an entity described or recited as being "configured to" perform some tasks refers to something physical, such as a device, circuit, a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112 (f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used to transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Numerous variations and modifications will become apparent to those skilled in the art once the above disclosure is fully appreciated. It is intended that the following claims be interpreted to embrace all such variations and modifications.

What is claimed is:

1. An apparatus, comprising:
    a current generator circuit configured to generate an output current that approximates an exponential variation with respect to a plurality of input codes using a reference voltage and a feedback signal;
    a reference voltage circuit configured to determine respective values for the reference voltage for the plurality of input codes; and
    a variable resistance circuit coupled to the current generator circuit, wherein the variable resistance circuit is configured to
        adjust a resistance between the current generator circuit and a ground supply node based on the plurality of input codes; and
        generate the feedback signal using the output current.

2. The apparatus of claim 1, wherein the reference voltage circuit includes a control circuit and a plurality of reference circuits configured to generate respective ones of a plurality of reference voltages, and wherein to determine respective values for the reference voltage for the plurality of input codes, the reference voltage circuit is further configured to select one of the plurality of reference voltages based on a first subset of a plurality of bits included in a given input code.

3. The apparatus of claim 2, wherein to adjust the resistance between the current generator circuit and the ground supply node, the variable resistance circuit is further configured to adjust the resistance based on a second subset of the plurality of bits included in the given input code, wherein the second subset of the plurality of bits are less significant than the first subset of the plurality of bits.

4. The apparatus of claim 1, wherein the current generator circuit includes at least one transistor coupled in series with the variable resistance circuit between a power supply node and the ground supply node, and wherein to generate the output current, the current generator circuit is configured to adjust a conductance of the at least one transistor.

5. The apparatus of claim 4, wherein the current generator circuit is further configured to:
    compare the reference voltage and the feedback signal to generate a control signal; and
    adjust the conductance of the at least one transistor using the control signal.

6. The apparatus of claim 1, wherein a value of the feedback signal corresponds to a voltage drop across the variable resistance circuit.

7. A method, comprising:
    receiving, by a digital-to-analog converter circuit, a plurality of input codes that include respective pluralities of bits;
    determining, by the digital-to-analog converter circuit, a particular reference voltage for a given input code of the plurality of input codes;
    determining, by the digital-to-analog converter circuit for the given input code, a particular value for a variable resistor included in the digital-to-analog converter circuit;
    generating a feedback signal using the variable resistor and an output current; and
    generating, by the digital-to-analog converter circuit, the output current using the particular reference voltage and the feedback signal.

8. The method of claim 7, wherein determining the particular reference voltage includes determining the particular reference voltage based on a first subset of a plurality of bits included in the given input code.

9. The method of claim 8, wherein determining the particular value for the variable resistor includes determining the particular value for the variable resistor based on a second subset of the plurality of bits included in the given input code, wherein the second subset is different than the first subset.

10. The method of claim 7, further comprising generating a plurality of reference voltages, and wherein determining the particular reference voltage includes selecting one of the plurality of reference voltages based on the given input code.

11. The method of claim 7, wherein the digital-to-analog converter circuit includes at least one transistor coupled in series with the variable resistor between a power supply node and a ground supply node, and wherein generating the output current includes adjusting a conductance of the at least one transistor.

12. The method of claim 11, further comprising comparing the particular reference voltage to the feedback signal to generate a control signal, and further comprising adjusting the conductance of the at least one transistor using the control signal.

13. The method of claim 7, further comprising activating a light-emitting diode by sinking the output current from a cathode terminal of the light-emitting diode, wherein an anode terminal of the light-emitting diode is coupled to a power supply node.

14. An apparatus, comprising:
    a plurality of light-emitting diodes coupled to a power supply node; and
    a plurality of current-mode digital-to-analog converter circuits coupled to corresponding ones of the plurality of light-emitting diodes, wherein the plurality of current-mode digital-to-analog converter circuits includes a given current-mode digital-to-analog converter circuit configured to:
        receive a plurality of input codes that include respective pluralities of bits;
        determine a particular reference voltage for a given input code of the plurality of input codes;
        determine, for the given input code, a particular value for a variable resistor included in the given current-mode digital-to-analog converter circuit;
        generate a feedback signal using the variable resistor and an output current; and
        sink the output current from a cathode terminal of a corresponding light-emitting diode of the plurality of light-emitting diodes, wherein a value of the output current is based on respective values of the particular reference voltage and the feedback signal.

15. The apparatus of claim 14, further comprising a power converter circuit configured to generate a regulated supply voltage on the power supply node.

16. The apparatus of claim 15, further comprising a selection circuit configured to select a minimum of respective voltages of corresponding cathode terminals of the plurality of light-emitting diodes to generate a minimum voltage signal, and wherein the power converter circuit is further configured to generate the regulated supply voltage using the minimum voltage signal.

17. The apparatus of claim 14, wherein to determine the particular reference voltage, the given current-mode digital-to-analog converter circuit is further configured to determine the particular reference voltage based on a first subset of a plurality of bits included in the given input code.

18. The apparatus of claim 17, wherein to determine the particular value for the variable resistor, the given current-mode digital-to-analog converter circuit is further configured to determine the particular value for the variable resistor based on a second subset of the plurality of bits included in the given input code, wherein the second subset is different than the first subset.

19. The apparatus of claim 14, wherein the given current-mode digital-to-analog converter circuit includes a plurality of voltage reference circuits configured to generate a plurality of reference voltages, and wherein to determine the particular reference voltage, the given current-mode digital-to-analog converter circuit is further configured to select one of the plurality of reference voltages based on the given input code.

20. The apparatus of claim 14, wherein to sink the output current, the given current-mode digital-to-analog converter circuit is further configured to adjust a conductance between the cathode terminal of the corresponding light-emitting diode based on a comparison of the particular reference voltage and a voltage drop across the variable resistor.

* * * * *